United States Patent [19]

Jenner et al.

[11] Patent Number: 4,815,199

[45] Date of Patent: Mar. 28, 1989

[54] METHOD OF MANUFACUTRING A THERMAL IMAGING DEVICE WITH THERMALLY INSULATED SENSOR ELEMENTS

[75] Inventors: Michael D. Jenner; Joy A. Lamb, both of Southampton, England

[73] Assignee: U.S. Philips Corp., New York, N.Y.

[21] Appl. No.: 920,647

[22] Filed: Oct. 20, 1986

Related U.S. Application Data

[62] Division of Ser. No. 759,997, Jul. 29, 1985, Pat. No. 4,663,529.

[30] Foreign Application Priority Data

Aug. 24, 1984 [GB] United Kingdom ............... 8421506

[51] Int. Cl.⁴ ............................................. G07J 5/22
[52] U.S. Cl. ................................. 29/840; 29/25.35; 29/592.1; 250/338.2; 250/338.3
[58] Field of Search .............. 250/338 PY; 29/25.35, 29/592, 840

[56] References Cited

U.S. PATENT DOCUMENTS

| | | | |
|---|---|---|---|
| 4,009,516 | 3/1977 | Chiang et al. | 29/25.35 X |
| 4,354,109 | 10/1982 | Gelpey et al. | 250/338 PY |
| 4,383,174 | 5/1983 | Matsumura et al. | 250/338 PY |
| 4,593,456 | 6/1986 | Cheung | 250/338 PY |
| 4,663,529 | 5/1987 | Jenner et al. | 250/338 |

FOREIGN PATENT DOCUMENTS 0077730 6/1981 Japan ............... 250/338 PY

Primary Examiner—Howard N. Goldberg
Assistant Examiner—Taylor J. Ross
Attorney, Agent, or Firm—William L. Botjer

[57] ABSTRACT

A thermal imaging device is manufactured by providing electrodes on opposite sides of a slab of ferroelectric or pyroelectric material. A sheet of electrically and thermally insulating material is bonded to the signal electrode layer on one side of the slab. An electrically conductive layer is provided on the insulating sheet. An array of spaced bores is then formed. Each bore extends through the electrically conductive layer down to the signal layer. The bores are then coated with electrically conductive material to electrically connect the signal electrode layer to the electrically conductive layer. Thereafter, a pattern of channels is formed surrounding the bores. The channels extend through the electrically conductive layer down to the slab, so as to form separate pillars of insulating material from the insulating sheet, and separate signal electrodes from the signal layer. Finally, the electrically conductive coated bores are connected to a circuit substrate by way of solder bumps.

6 Claims, 2 Drawing Sheets

METHOD OF MANUFACUTRING A THERMAL IMAGING DEVICE WITH THERMALLY INSULATED SENSOR ELEMENTS

This is a division of application Ser. No. 759,997 filed July 29, 1985 now U.S. Pat. No. 4,663,529.

BACKGROUND OF THE INVENTION

The invention relates to a thermal imaging device comprising a slab of ferroelectric or pyroelectric material bearing an infrared-permeable common electrode on one main surface and a signal electrode structure on the opposite main surface. The signal electrode structure is electrically connected to electrodes of a circuit substrate by conductors surrounded by a thermally insulating material.

The present invention also provides a method of manufacturing a thermal imaging device, which method comprises the steps of providing a slab of ferroelectric or pyroelectric material with an infrared-permeable common electrode on one main surface and with a signal electrode layer on the opposite main surface.

A significant problem with such devices is to provide adequate mechanical support for the slab of ferroelectric material, while at the same time providing good thermal isolation between adjacent sensing regions and between the sensing regions of the device and the circuit substrate. The substrate is, for example, an electronic multiplexer.

U.S. Pat. No. 4,143,269 describes a ferroelectric imaging system in which the conductors are conductor rods which are either in a vacuum (in which case it does not appear that the conductor structure per se will provide adequate mechanical support for the ferroelectric slab), or are embedded in a mass of thermally insulating material (for example, a glass-filled photoresist). When the conductor rods are embedded in such a mass of thermally insulating material, there is still a heat flow between adjacent detector elements in a direction transverse to the longitudinal axes of the conductors. The heat flow impairs the device performance in two ways.

Firstly, there is a degradation of the thermal limits of detection. Thus, the transverse heat conductance provides a significant contribution to the signal produced by a given sensing element. Secondly, the transverse flow of heat can cause thermal crosstalk between adjacent elements.

SUMMARY OF THE INVENTION

It is an object of the invention to mechanically support a thermal imaging target while thermally insulating target segments from the device substrate and from each other.

According to the invention each conductor is a metal coating on a bore in a pillar of insulating material. According to another aspect of the invention, a thermal imaging device comprises an integral array of ferroelectric or pyroelectric plates. Each plate bears an infrared-permeable electrode on one main surface and a signal electrode on the opposite main surface, adjacent plates are interconnected at their edges by an electrically and thermally insulating material. The signal electrodes are electrically connected to electrodes of a circuit substrate by conductors surrounded by a thermally insulating material. Each conductor is a metal coating on a bore in a pillar of insulating material.

In the method according to the present invention, a a sheet of thermally insulating material is bonded to the signal electrode layer an electrically conductive layer is provided on the insulating sheet, and a first photoresist layer is provided on the electrically conductive layer. The first photoresist layer is exposed and the exposed photoresist is developed so as to form an array of spaced apertures.

Through these apertures, bores are etched down to the signal electrode layer. An electrically conductive coating is provided on the surface of each bore so as to electrically connect the signal electrode layer to the electrically conductive layer on the insulating sheet. The remainder of the first photoresist layer and any superposed electrically conductive coating material are then removed.

A second photoresist layer is then provided on the electrically conductive layer on the insulating sheet so as to close the open ends of the bores. The second photoresist layer is exposed and the exposed resist is developed so as to form a pattern of channels which define islands of photoresist. Each island is disposed over and around a respective bore.

Channels which extend down to the ferroelectric or pyroelectric slab are etched so as to form pillars of insulating material which are each coaxial with a respective signal electrode. Each pillar surrounds a respective bore in the insulating material.

The remainder of the second photoresist layer is removed, and conductor elements of a circuit substrate are bonded to respective portions of the electrically conductive layer on a respective pillars by solder bumps. Preferably the channels extend into the ferroelectric or pyroelectric slab so as to further reduce the transverse heat conductance in the imaging device. The bores may extend down to the ferroelectric or pyroelectric slab.

The ferroelectric material may be, for example, a lead zirconate titanate, a barium strontium titanate, or a potassium tantaloniobate. Triglycine sulphate is an example of a suitable pyroelectric material.

The thermally insulating material may be, for example, cadmium telluride, tellurium, selenium or sulphur. The thermally insulating sheet may be bonded to the signal electrode material, for example, by a thermosetting adhesive, for example an epoxy resin.

The infrared-permeable electrode material may be, for example, chromium or a nickel-chromium alloy. The bores and channels may be formed, for example, by ion beam milling or reactive ion etching.

Instead of using a single thermally insulating sheet, a stack of thermally insulating plates, bonded together by adhesive films which are disposed between each pair of sheets, may be used to improve the thermal isolation of the thermal imaging array from the circuit substrate. The transverse flow of heat between sensing elements may be further reduced by sizes in the bores of the plates in the stack. The bores in the plates nearest are smaller than the signal electrode layer to the bores in the plate nearest to the circuit substrate.

BRIEF DESCRIPTION OF THE DRAWING

FIGS. 6b and 6c are sectional elevations showing two further steps in the manufacture of an integral array of ferroelectric plates from the grooved ferroelectric slab shown in FIG. 6a.

DESCRIPTION OF THE PREFERRED EMBODIMENTS

EXAMPLE 1

Figure 1:
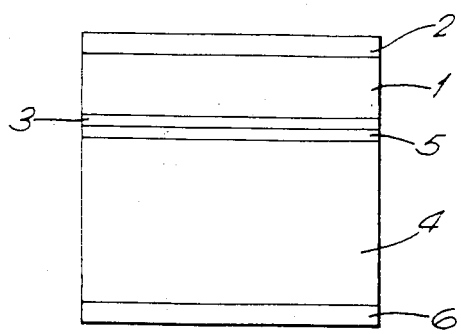
FIG. 1 is a side elevation of a unitary stack of components from which a ferroelectric detector array is produced.

Referring to FIG. 1, a 6 $\mu$m thick ferroelectric slab 1 of lead zirconate titanate was provided with an infrared-permeable electrically conductive layer 2 of nickel-chromium having a surface resistance of 300$\Omega$ per square on one main surface. Slab 1 was also provided with an electrode layer 3 of nickel-chromium having a surface resistance of 60$\Omega$ per square on the opposite main surface. Both of the layers 2 and 3 were formed by sputtering using a planar magnetron.

A 17 $\mu$m thick thermally insulating sheet 4 of cadmium telluride was then bonded to the electrode layer 3 by means of a 1 $\mu$m thick epoxy resin film 5. A 3 $\mu$m thick indium layer 6 was provided on the exposed main surface of the insulating sheet 4. The thickness of each of the layers 2, 3 and 6 and of the film 5 has been greatly exaggerated in the drawings for the sake of clarity.

A first photoresist layer (not shown) was then provided on the exposed main surface of the indium layer 6, and an array of 10 $\mu$m diameter holes, spaced at a pitch of 40 $\mu$m, was formed in the photoresist layer by exposure through a suitable mask and then developing the exposed photoresist.

Figure 2:
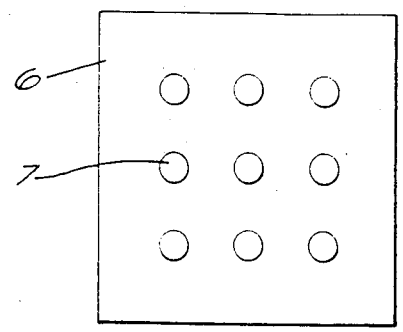
FIG. 2 is a plan view of the stack shown in FIG. 1 after a pattern of blind bores have been formed in the stack.
Figure 4:
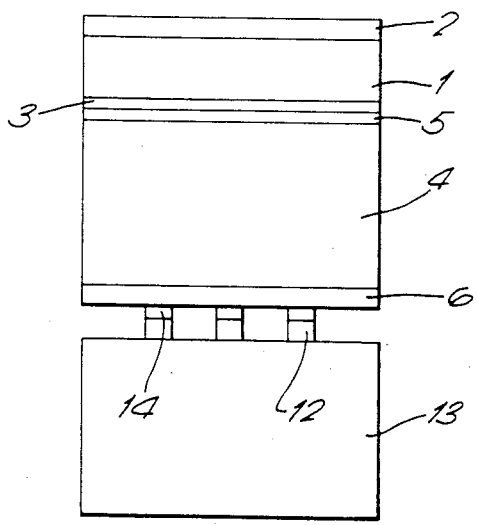
FIG. 4 is a side elevation of a device comprising the ferroelectric detector array secured to a circuit substrate.

A pattern of blind bores 7 (FIG. 2), which each extend down to the nickel-chromium layer 3, was produced by ion beam milling in argon. Conductors 8 (FIG. 5) were formed in each of the bores 7 by sputtering 0.3 $\mu$m thick composite layers of chromium (0.02 $\mu$m) and gold (0.28 $\mu$m) using a planar magnetron. The remainder of the first photoresist layer and the superposed chromium-gold composite were then lifted off the indium layer 6.

A second photoresist layer (not shown) was applied to the exposed indium layer and closed the open ends of the bores 7. A grid-shaped pattern was then formed in the second photoresist layer by exposure through a suitable mask followed by development of the exposed photoresist.

Figure 3:
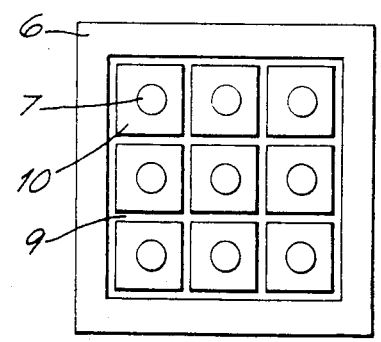
FIG. 3 is a plan view similar to that shown in FIG. 2, after a pattern of channels has been formed in the stack.

10 $\mu$m wide channels 9 (FIG. 3) which extended down to the ferroelectric slab 1 were formed by ion beam milling. These channels 9 defined insulating pillars 10 (FIGS. 3 and 5) each having a cross-section of 30 $\mu$m $\times$ 30 $\mu$m. Each pillar 10 surrounds a bore 7. The channels 9 also defined signal electrodes 11 (FIG. 5) having external cross-sections similar to those of the pillars 10.

Figure 5:
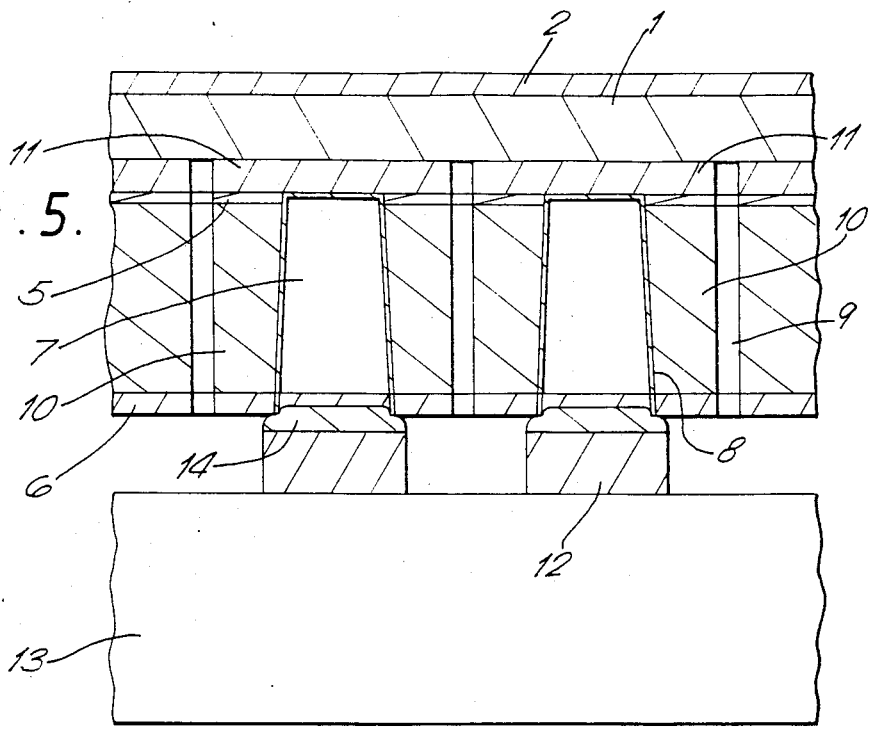
FIG. 5 is a sectional elevation of part of the device shown in FIG. 4 on an enlarged scale.

Referring to FIG. 5, the thermal imaging array produced as described with reference to FIGS. 1 to 4 was then secured to electrodes 12 of a CCD circuit substrate 13 by means of indium bumps 14. Bumps 14 extend into respective bores 7 and were fused to the conductors 8 and to the exposed surface of the indium layer 6.

EXAMPLE 2

Figure 6B:
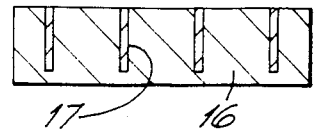
Figure 6A:
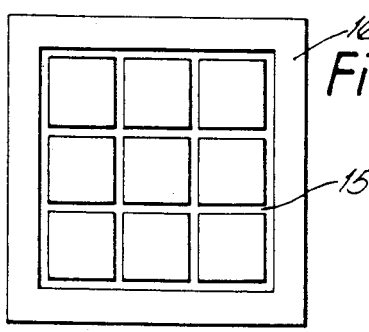
FIG. 6a is a plan view of a ferroelectric slab in which grooves have been etched.
Figure 6C:
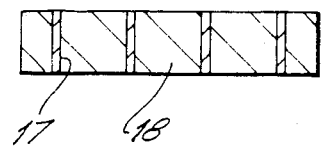
Figure 7:
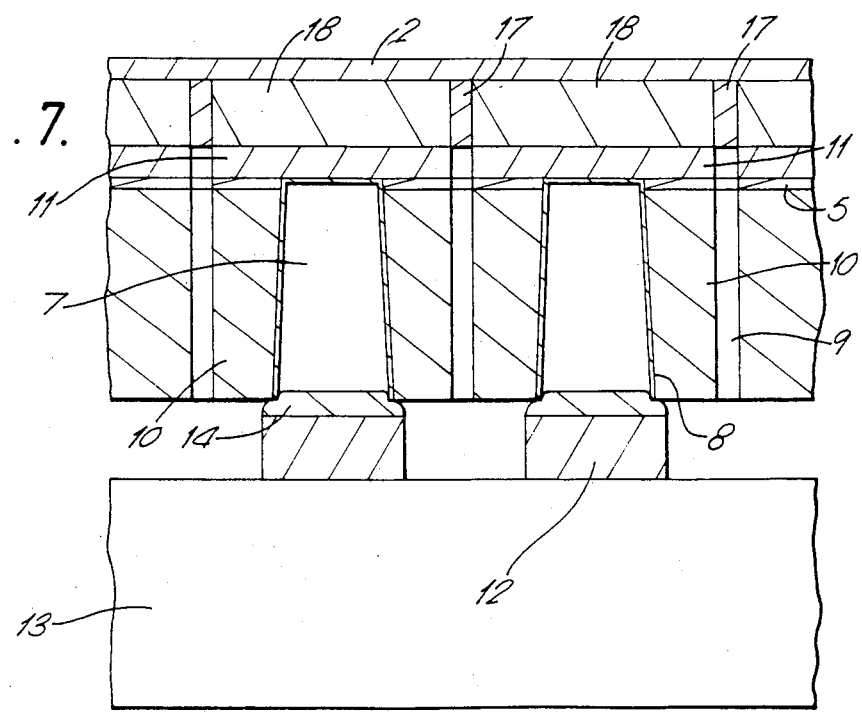
FIG. 7 is a selectional elevation of part of a thermal imaging device which includes the integral array of ferroelectric plates shown in FIG. 6c.

Referring to FIG. 6a, a grid of slots 15 was etched by ion beam milling to a depth of 6 $\mu$m in a 9 $\mu$m thick lead zirconate titanate slab 16. These slots 15 were then filled with an epoxy resin 17 (FIG. 6b), and the continuous main surface of the slab 16 was ground until the epoxy resin 17 was exposed. The integral array of ferroelectric plates 18 (FIG. 6c) was then used to make a thermal imaging device, part of which is shown in FIG. 7, by performing the relevant process steps described in Example 1 with respect to FIGS. 1 to 5. The channels 9 which define the pillars 10 were in registration with the resin-filled grooves 15 which define the ferroelectric plates 18.

We claim:

1. A method of manufacturing a thermal imaging device, said method comprising the steps of:
   providing a slab of ferroelectric or pyroelectric material having first and second opposite surfaces;
   providing an infrared-permeable common electrode on the first surface;
   providing a signal electrode layer on the second surface;
   bonding a sheet of electrically and thermally insulating material to the signal electrode layer;
   providing an electrically conductive layer on the insulating sheet;
   forming an array of spaced bores, said bores extending through the electrically conductive layer down to the signal electrode layer;
   coating the bores with electrically conductive material to electrically connect the signal electrode layer to the electrically conductive layer;
   forming a pattern of channels surrounding the bores, said channels extending through the electrically conductive layer down to the slab, so as to form separate pillars of insulating material from the insulating sheet and separate signal electrodes from the signal electrode layer; and
   electrically connecting the electrically conductive coated bores to a circuit substrate by way of solder bumps.

2. A method as claimed in claim 1, characterized in that the bores extend down to the slab, and the electrically conductive coating on each bore extends down to the slab.

3. A method as claimed in claim 1, characterized in that the channels extend into the slab.

4. A method as claimed in claim 3, characterized in that the insulating sheet is bonded to the signal electrode layer by a thermosetting adhesive.

5. A method as claimed in claim 4, characterized in that the insulating sheet comprises a stack of thermally insulating plates bonded together by adhesive films disposed between each pair of plates.

6. A method as claimed in claim 5, characterized in that the sizes of the bores in the plates increase in the direction from the signal electrode to the circuit substrate.

* * * * *